United States Patent [19]
Selcuk et al.

[11] Patent Number: 5,879,980
[45] Date of Patent: Mar. 9, 1999

[54] METHOD OF MAKING STATIC RANDOM ACCESS MEMORY CELL HAVING A TRENCH FIELD PLATE FOR INCREASED CAPACITANCE

[75] Inventors: Asim A. Selcuk, Cupertino; Raymond T. Lee, Sunnyvale, both of Calif.

[73] Assignee: Advanced Micro Devices, Inc., Sunnyvale, Calif.

[21] Appl. No.: 823,817

[22] Filed: Mar. 24, 1997

[51] Int. Cl.$^6$ .................................................. H01L 21/8244
[52] U.S. Cl. ........................... 438/238; 438/430; 438/454
[58] Field of Search .................................... 438/238, 239, 438/241, 386, 430, 454

[56] References Cited

U.S. PATENT DOCUMENTS

| | | | |
|---|---|---|---|
| 4,987,090 | 1/1991 | Hsu et al. ............................... | 438/238 |
| 5,252,506 | 10/1993 | Carter et al. ............................ | 438/454 |
| 5,459,686 | 10/1995 | Saito ....................................... | 365/149 |
| 5,487,044 | 1/1996 | Kawaguchi et al. .................... | 365/203 |
| 5,489,790 | 2/1996 | Lage ....................................... | 257/330 |

*Primary Examiner*—Chandra Chaudhari
*Attorney, Agent, or Firm*—Foley & Lardner

[57] ABSTRACT

A static random access memory (SRAM) cell having increased cell capacitance at the storage nodes utilizes a capacitive structure disposed in a trench. The capacitive structure includes an oxide liner disposed underneath a polysilicon or tungsten plug. The polysilicon plugs are each isolated from the drains of lateral transistors associated with the SRAM cell. The capacitive structure is provided between first and second N-channel pull down transistors associated with the SRAM cell. The polysilicon plug can be provided during the formation of local interconnects for the cell. The polysilicon material or plug can be coupled to the semiconductor substrate.

20 Claims, 7 Drawing Sheets

METHOD OF MAKING STATIC RANDOM ACCESS MEMORY CELL HAVING A TRENCH FIELD PLATE FOR INCREASED CAPACITANCE

CROSS REFERENCE TO RELATED CASES

The present application is related to U.S. application Ser. No. 08/822,518 entitled, "A Memory Cell Having Increased Capacitance Via A Local Interconnect To Gate Capacitor And A Method For Making Such A Cell," filed by Kepler et al. on an even date herewith. The present application is also related to U.S. application Ser. No. 08/823,081 entitled, "A Static Random Access Memory Cell Having Buried Sidewall Capacitors Between Storage Nodes And A Method For Making Such A Cell," filed by Selcuk on an even date herewith.

FIELD OF THE INVENTION

The present invention relates generally to integrated circuit devices having enhanced capacitance. More particularly, the present invention relates to an SRAM cell having enhanced capacitance.

BACKGROUND OF THE INVENTION

Semiconductor memory devices such as random access memory (RAM) devices typically include a number of memory cells coupled to at least one bit line. The memory cells often include at least one storage device, storage node, and pass gate transistor. Generally, in a static random access memory (SRAM) cell, two storage devices such as drive transistors are coupled between two pass gate transistors, and a bit line is coupled to each of the pass gate transistors. Thus, each memory cell is often located between two bit lines.

The pass gate transistors (e.g., transfer gates) have gate electrodes which are coupled to word lines. A signal such as an address or select signal is provided on the word line associated with the memory cell to select or access a particular memory cell. Once the memory cell is selected via the word line, the memory cell can be read or written to through the pass gate transistors via the bit lines.

The memory cell of the SRAM often contains two inverters connected in anti-parallel. Basically, each cell is a flip-flop which has two stable states (e.g., a logic 1 or a logic 0). The memory cell is generally made of four or six transistors. In a four transistor SRAM cell, a first resistor is coupled in series with a first pull down (e.g., storage or drive) transistor at a first storage node, and a second resistor is coupled in series with a second pull down transistor at a second storage node. A first pass gate is coupled between a first bit line and the first storage node, and a second pass gate is coupled between a second bit line and a second storage node.

In a six transistor memory cell, the first and second resistors are replaced by first and second load transistors. The load transistors can be P-channel transistors or depletion mode N-channel transistors. The pull down transistors and pass gate transistors for both four transistor cells and six transistor cells are usually N-channel enhancement mode transistors.

As technology advances, memory cell size has steadily decreased so more memory cells can be located on a single semiconductor substrate. Additionally, power supply has decreased. The decreased memory cell size and power supply reduces the amount of charge stored at each of the storage nodes. The trend of decreasing charge storage per node makes the memory cell more susceptible to charge loss due to parasitic leakage problems.

Thus, there is a need for a memory cell with enhanced charge storage capacity. Further, there is a need for a memory cell of minimal size which can store and retain logic signals for an extended period of time. Further still, there is a need for a stable memory cell of small size which is relatively immune to noise and which does not require a significant number of additional fabrication steps.

SUMMARY OF THE INVENTION

The present invention relates to a memory cell having enhanced coupling capacitance. The memory cell includes a first pull down transistor and a second pull down transistor. The first pull down transistor is coupled to a first storage node, and the second pull down transistor is coupled to a second storage node. The first pull down transistor is near the second pull down transistor, and the first pull down transistor is separated from the second pull down transistor by a trench. The trench has sidewalls lined with an insulating material. The trench is filled with a conductive material to form a trench capacitive element proximate to the first storage node.

The present invention further relates to a method of manufacturing a memory cell having a field capacitor between a first storage node and a second storage node. The memory cell includes first and second pull down transistors formed on a semiconductor substrate. The method includes steps of forming an isolation trench in the semiconductor substrate at a location between the first and second pull down transistors, providing a liner oxide within the isolation trench, and depositing a conductive material in the trench to substantially fill the trench. The location is proximate to either or both storage nodes.

The present invention still further relates to a method of manufacturing a memory cell having a field capacitor between a first storage node and second storage node. The memory cell includes first pull down transistor and second pull down transistors formed on a substrate. The method comprises steps of removing a trench dielectric in a trench separating the first pull down transistor and the second pull down transistor, providing an etch stop layer, providing an insulating layer over the first pull down transistor and the second pull down transistor, selectively removing the insulating layer from between the first pull down transistor and the second pull down transistor, and depositing a conductive material in the trench. The etch stop layer lines a side wall of the trench and the conductive material substantially fills the trench.

In one aspect of the present invention, the stability of an SRAM memory cell is enhanced by providing a capacitive structure within the semiconductor substrate associated with the memory cell. The capacitive structure is preferably located within an isolation trench. The structure can be a floating field capacitor or can be a field capacitor coupled to ground via the substrate. The drains (e.g., the storage nodes of the cell) of the pull down transistors make one plate of the field capacitor, and the conductive material in the trench make the other plate of the field capacitor. The capacitive structure is located between the drain regions. The capacitive conductive material substantially fills the trench which is lined with a dielectric material. The capacitive structure enhances the capacitance associated with the memory cell.

In another aspect of the invention, the enhanced capacitance of the memory cell is schematically embodied by two capacitors. The two capacitors are coupled in series between the two storage nodes. The capacitors allow the memory cell to operate more stably and have more noise immunity because the memory cell can store more charge.

In yet another aspect of the present invention, a field capacitor is formed by depositing doped polysilicon in an isolation trench between lateral pull down transistors of the cell. The isolation trench can be a shallow trench isolation feature which has its oxide material removed by etching. The trench is lined with a dielectric material.

In still another aspect, the originally filled dielectric material in the trench is removed just before local interconnect process steps. The etch stop layer commonly used in the local interconnect process forms a liner in the trench, and the local interconnect conductor is deposited in the trench to form the field capacitor. The use of local interconnect process steps to make the field capacitor allows the field capacitor to be formed in a minimal amount of extra process steps.

BRIEF DESCRIPTION OF THE DRAWINGS

The invention will hereafter be described with reference to the accompanying drawings wherein like numerals denote like elements, and.

DETAILED DESCRIPTION OF PREFERRED EXEMPLARY EMBODIMENTS OF THE PRESENT INVENTION

Figure 1:
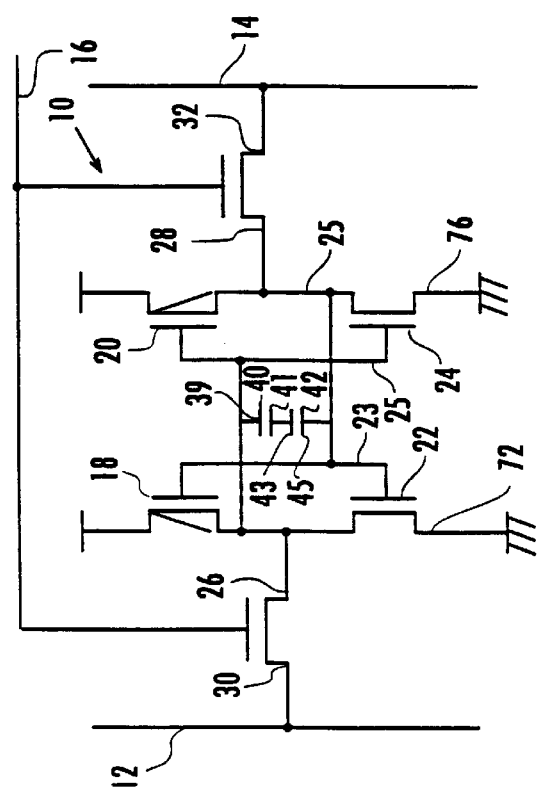
FIG. 1 is an electrical schematic drawing of a memory cell in accordance with an exemplary embodiment of the present invention.

With reference to FIG. 1, a memory cell 10 is coupled between complimentary bit lines 12 and 14 and is coupled to a word line 16. Memory cell 10 is preferably a static random access memory cell (SRAM) including a load transistor 18, a load transistor 20, a drive or pull down transistor 22 and a pull down transistor 24. Transistors 18, 20, 22, and 24 are coupled together to form cross-coupled inverters having a storage node 26 and a storage node 28.

Transistors 18 and 20 are preferably P-channel transistors, but may be replaced by polysilicon or other resistors, N-channel depletion mode transistors, or other electrical devices for dropping the voltage at storage nodes 26 and 28 when pull down transistors 22 and 24 are turned on, respectively. Pull down transistors 22 and 24 are preferably N-channel transistors, although other types of transistors such as bipolar transistors or other devices may be utilized. Transistors 22 and 24 are preferably conventional enhancement mode transistors having a gate threshold voltage between 0.5 and 0.6 volts (V).

Storage node 26 is coupled to a pass gate transistor 30 which is controlled by word line 16. Storage node 28 is coupled to a pass gate transistor 32 which is also controlled by word line 16. Pass gate transistors 30 and 32 are preferably N-channel enhancement mode transistors having a gate threshold voltage between 0.5 and 0.60, although other types of transistors may be utilized.

Transistors 18 and 22 form a first inverter having an input at conductive line 23, and transistors 20 and 24 form a second inverter having an input at conductive line 25. Conductive line 23 is coupled to the output of the second inverter formed by transistors 20 and 24 (e.g., storage node 28). Similarly, conductive line 25 is coupled to the output of the first inverter formed by transistors 18 and 22 (e.g., storage node 26). Thus, transistors 18, 20, 22 and 24 form cross coupled inverters having outputs at storage nodes 26 and 28.

In operation, cell 10 stores logic signals data, or information such as a logic 1 (e.g., VCC) or logic 0 (e.g., ground) on nodes 26 and 28. When transistor 22 is turned on, transistor 18 is turned off and node 26 is coupled to ground. When transistor 24 is turned off, transistor 20 is turned on and node 28 is coupled to VCC or power. Conversely, when transistor 22 is turned off, transistor 18 is turned on and node 26 is coupled to VCC. When transistor 24 is turned on, transistor 20 is turned off and node 28 is coupled to ground. Generally, the logic level stored on node 26 is opposite the logic level stored on node 28.

Cell 10 is accessed for reading from and writing to nodes 26 and 28 when a select signal, such as a logic 1 or VCC, is provided on word line 16. Memory cell 10 is accessed as pass gate transistors 30 and 32 couple bit lines 12 and 14 to nodes 26 and 28, respectively, in response to the select signal on word line 16. Generally, the signals on lines 12 and 14 are complementary to each other.

In a read operation, cell 10 is accessed by providing the select signal on line 16. During the read operation, the signal at storage node 26 is provided to bit line 12 while the signal at storage node 28 is provided to bit line 14. The signals on lines 12 and 14 are then read by a sense amplifier (not shown).

In a write operation, cell 10 is accessed by providing the select signal on line 16. During the write operation, the signal on bit line 12 is driven to node 26 while the signal on bit line 14 is driven to node 28. After the select signal on line 16 is removed, cell 10 stores the signals driven on lines 12 and 14. Cell 10 stores the signals on nodes 26 and 28, respectively.

To increase charge storage capacity of nodes 26 and 28, memory cell 10 advantageously employs a capacitor 40 between storage node 26 and 28, and a capacitor 42 between storage nodes 26 and 28. Capacitor 40 includes a plate 39 and a plate 41, and capacitor 42 includes a plate 43 and a plate 45.

Capacitors 40 and 42 allow transistors 18, 20, 22 and 24 to store more charge on storage nodes 26 and 28. Therefore, despite the small size of cell 10 and the length of lines 12 and 14, nodes 26 and 28 can provide stable logic signals on lines 12 and 14. Additionally, the enhanced capacitance increases the stability and noise immunity of cell 10.

Figure 2:
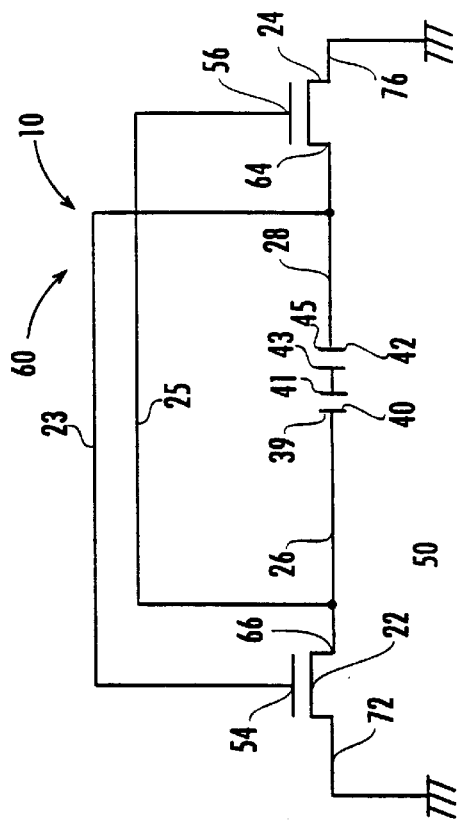
FIG. 2 is a more detailed electrical schematic drawing of a portion of the memory cell illustrated in FIG. 1 in accordance with an exemplary embodiment of the present invention.

With reference to FIG. 2, a portion 60 of cell 10 is shown for simplicity. Transistors 22 and 24 are preferably lateral transistors. Additionally, transistors 18, 20, 22, 24, 30 and 32 can be lateral transistors, vertical transistors, or thin film transistors. A gate 54 of transistor 22 is coupled to node 28, and a gate 56 of transistor 24 is coupled to node 26. A drain 66 of transistor 22 is coupled to node 26, and a drain 64 of transistor 24 is coupled to node 28. A source 72 of transistor 22 is coupled to ground, and a source 76 of transistor 24 is coupled to ground.

Figure 3:
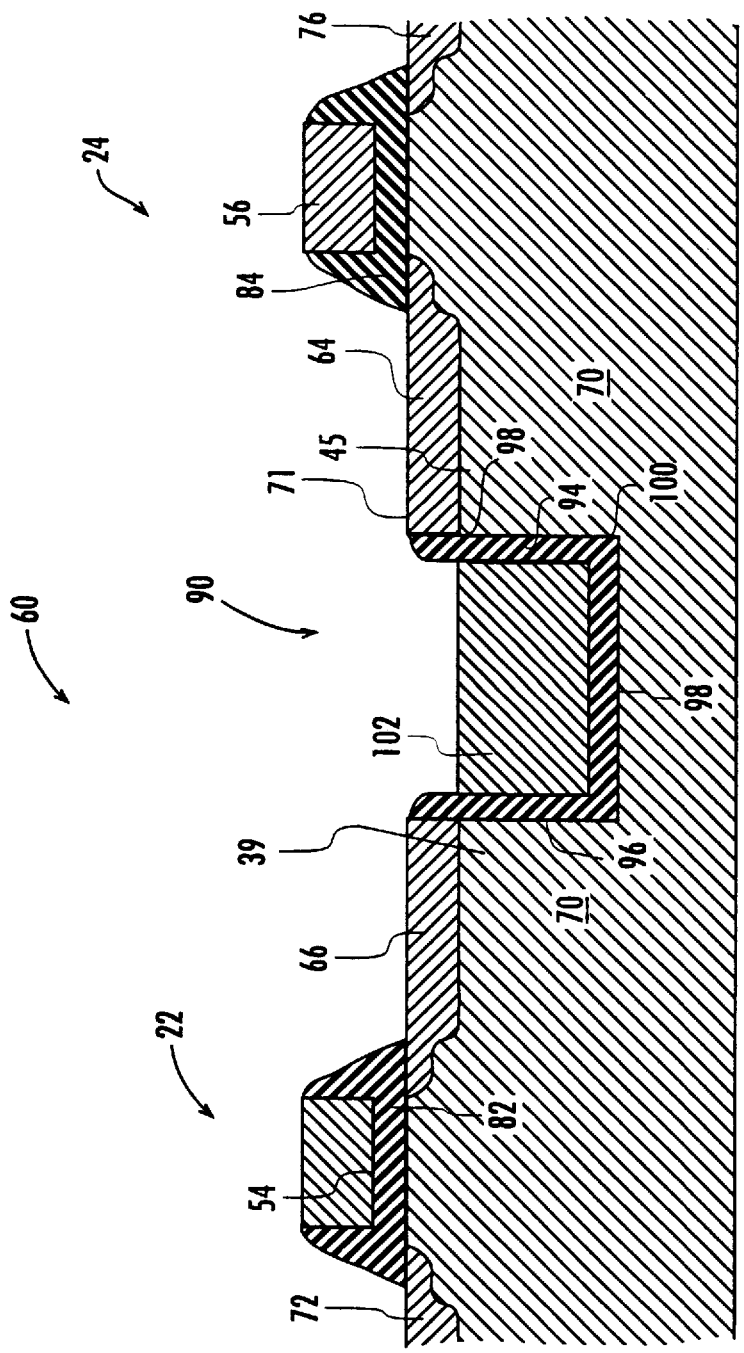
FIG. 3 is a cross-sectional view of a semiconductor substrate including the portion of the memory cell schematically illustrated in FIG. 2.

With reference to FIG. 3, a cross-sectional view of portion 60 includes transistor 22 and transistor 24. Transistor 22 is a lateral transistor formed in a semiconductor substrate 70. Transistor 22 includes drain 66, gate 54, and source 72. similarly, transistor 24 is a lateral translator formed in substrate 70. Transistor 24 includes drain 64, gate 56, and source 76. Drains 64 and 66 as well as sources 72 and 76 are highly doped N-type regions formed in a P-type substrate such as substrate 70. Substrate 70 is preferably coupled to ground or a substrate bias signal. Gate 54 is provided over a thin oxide layer 82, and gate 56 is provided over a thin oxide layer 84.

Portion 60 includes a capacitive structure (represented in FIGS. 1 and 2 by capacitors 40 and 42) formed in an isolation trench 90 which separates drain 66 of transistor 22 from drain 64 of transistor 24. Trench 90 includes a lateral wall 96, a bottom 98 and a lateral wall 100.

An insulative layer or liner 94 is formed on lateral wall 96, bottom 98 and lateral wall 100. A conductive layer or material 102 such as a doped polysilicon material or other conductive material is provided over liner 94 between walls 96 and 100 to form the capacitive structure between transistors 22 and 24. Material 102 can be deposited when gate conductors for gates 54 and 56 are formed, or when local interconnects are formed. Alternatively, material 102 can be deposited independently of other process steps.

Trench 90 is preferably from 0.3 to 0.4 microns deep and 0.375 microns wide (depending upon the fabrication technique and size constraints). The capacitance associated with the capacitive structure formed in isolation trench 90 can be increased by making trench 90 wider and deeper.

Conductive material 102 forms field capacitors 40 and 42 discussed with reference to FIGS. 1 and 2. Capacitor 40 is formed by plate 39 (drain 66) and plate 41 (material 102). Similarly, capacitor 42 is formed by plate 43 (material 102) and plate 45 (drain 64). Alternatively, plates 39 and 45 can be other conductors (not shown) coupled to drains 64 and 66. The capacitance associated with the capacitive structure formed in trench 90 can be increased by decreasing the thickness of liner 94. Material 102 can be any conductor or conductive material such as tungsten, silicides, amorphous silicon, doped silicon, titanium, or other conductive material.

Material 102 is preferably floating with respect to ground to reduce manufacturing steps associated with cell 10. Material 102 can be etched below a top surface 71 of substrate 70 to avoid contact with drains 64 and 66. Trench 90 and material 102 may be placed in other advantageous locations associated with cell 10. For example, trench 90 including material 102 can be placed between sources of transistors 18 and 20 or drains of transistors 30 and 32 to provide capacitance to cell 10. Additionally, several trenches 90 each including conductive material 102 can be utilized to increase the capacitance of cell 10.

Figure 4:
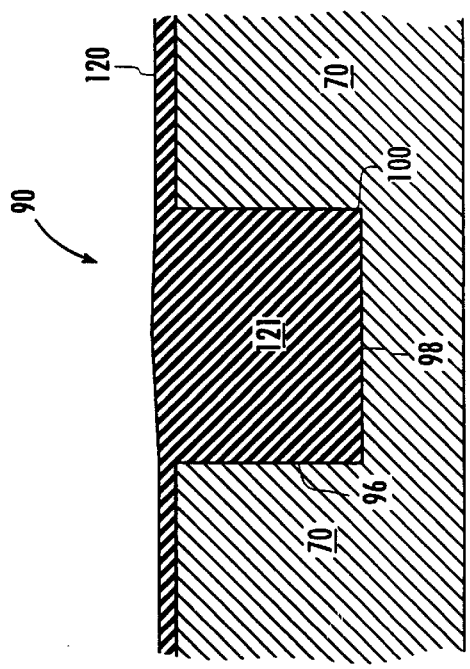
FIG. 4 is a cross-sectional view of the semiconductor substrate illustrated in FIG. 3 including an isolation trench.

With reference to FIGS. 3, 4, 5, and 6, a method of manufacturing cell 10 is described as follows. In FIG. 4, substrate 70 including portion 60 without transistors 22 and 24 is shown. A shallow trench 90 is formed in substrate 70. The preferred method of trench formation is shown whereby a standard barrier layer 122 (FIGURES) and a buffer oxide layer 120 are used to define the trench opening. Layer 122 is preferably silicon nitride, silicon oxynitride, Si3N4, SiON or other layer having both barrier properties against oxidation and removal selective to trench fill material 121. Layer 122 is approximately 1500 A as deposited. Layer 120 is approximately 100 A and is preferably thermally grown silicon dioxide. Trench 90 can be etched into substrate 70 by dry etching, wet etching or any technique for forming a trench between drains 64 and 66 (FIG. 3).

After trench 90 is formed, a short oxidation process is preferably used to round the profile of trench 90 (FIGURE). An insulating layer or material 123 can then be deposited to fill trench 90 to form an isolation trench. Material 123 is preferably silicon dioxide deposited by standard methods such as CVD, PECVD or spin on. Different versions of silicon oxide can be used such as spin-on-glass (SOG) or tetraethylorthosilicate (TEOS). A planarization process is used to remove all material 123 on top of the barrier layer 122 and recess the trench fill to the same level as barrier layer 122. The preferred method of planarization is Chemical-Mechanical-Polish (CMP) or combination of mask and etch and CMP.

Figure 5:
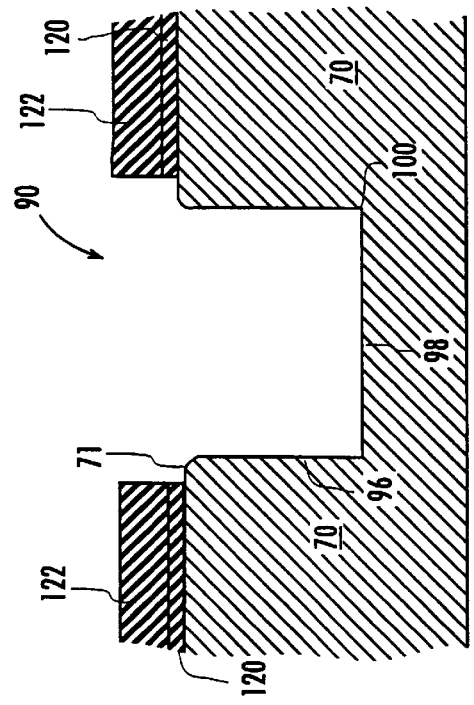
FIG. 5 is a cross-sectional view of the semiconductor substrate illustrated in FIG. 4 including an etch stop layer.

In FIG. 5, substrate 70 including portion 60 is shown without transistors 22 and 24. Substrate 70 has material 121 (FIG. 4) inside trench 90 selectively etched to form an opening for field capacitor formation. Barrier layer 122 conveniently serves as a self-aligned stop layer/hard mask for this etch. The presence of this self-aligned hard mask is not critical to this invention but is preferred for ease of implementation.

Substrate 70 can be used as the self-aligned hard mask but may require extra care in preventing damage to substrate surface 71 and shorting between surface 71 and field capacitor conductor material 102. Alternatively, portion 60 can have lateral transistors 22 and 24 (FIG. 3) substantially formed before material 121 is placed in trench 90. Material 123 can be selectively removed by dry etching, wet etching or any other accepted removal method to expose lateral wall 96, bottom 98 and lateral wall 100. Also, layer 123 can be exposed to a partial (only the top portion of layer 123 is removed) or complete (the full thickness of layer 123 is removed) etch. A partial etch will lead to a floating field capacitor and a complete etch can lead to a grounded or biased field capacitor.

Insulating layer 123 is deposited to form field capacitor dielectric liner 94 (FIG. 6) on lateral wall 96, bottom 98 and lateral wall 100 of trench 90. Liner 94 may be grown or deposited. Liner 94 preferably has a thickness of equal to or less than 500 A on walls 96 and 100 and on bottom 98. Liner 94 can be silicon dioxide, SOG, or other dielectric material.

Figure 6:
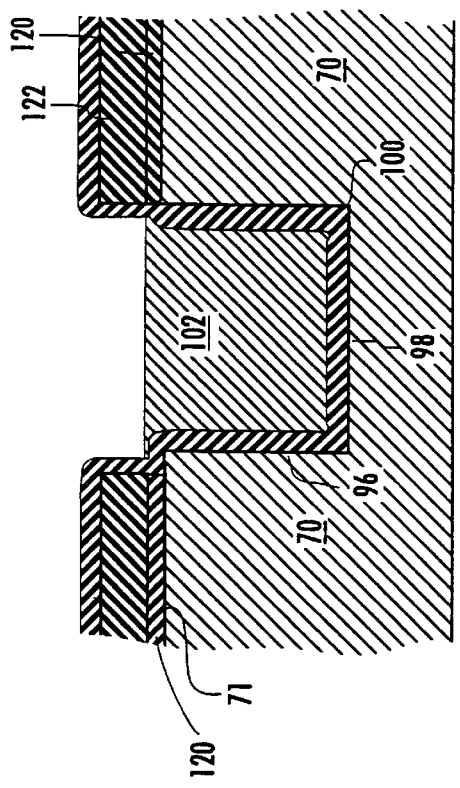
FIG. 6 is a cross-sectional view of the semiconductor substrate illustrated in FIG. 5 having a polysilicon layer deposited in the isolation trench.

With reference to FIG. 6, after liner 94 is provided within trench 90, material 102 is provided within trench 90. Material 102 has a width of approximately 0.275 microns.

Material 102 can be deposited as a conformal layer (with a thickness greater than one-half of the width of trench 90 so that trench 90 can be filled completely) and then selectively etched to leave material 102 in trench 90.

With reference to FIG. 3, material 102 is preferably etched back below layer 120 (FIG. 6) (surface 71) to prevent connection to drains 64 and 66. Additionally, layers 94, 120 and 122 are preferably removed from substrate 70 after the etch back of material 102 is completed. If lateral transistors 22 and 24 were not already formed prior to the etched back step, transistors 22 and 24 can be formed according to conventional fabrication processes after layers 120 and 122 (FIG. 4) are removed from top 71 surface of substrate 70. After transistors 22 and 24 are formed, an insulating layer (not shown) and local interconnect layers (not shown) are preferably formed to provide the various interconnections and isolation necessary for cell 10. Thus, cell 10 can be made according to conventional fabrication processes with modifications to provide the advantageous capacitive effects associated with capacitors 40 and 42. The fabrication processes advantageously do not interfere with the formation of transistors 22 and 24.

Figure 7:
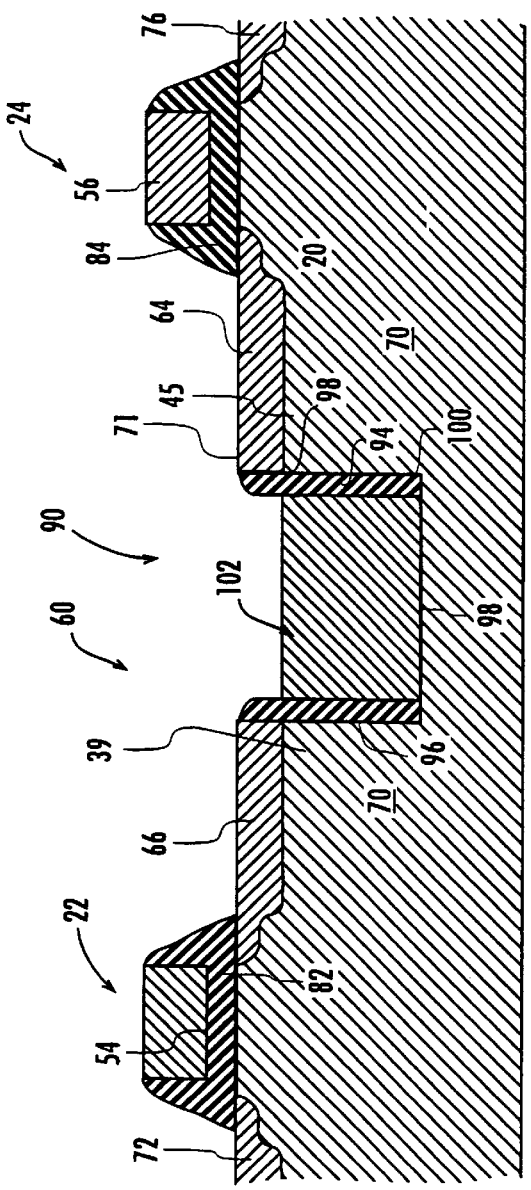
FIG. 7 is a cross-sectional view of the semiconductor substrate illustrated in FIG. 6 wherein the polysilicon layer is directly coupled to the substrate in the isolation trench in accordance with a second preferred exemplary embodiment of the present invention.

With reference to FIG. 7, a second preferred exemplary embodiment of the present invention is shown wherein conductive material 102 is coupled directly to substrate 70. This embodiment requires the complete removal of the original dielectric material 121 (FIG. 4) prior to liner 94 formation (FIG. 7). After liner 94 is formed, bottom 98 of trench 90 is anisotropically etched to remove liner 94 from bottom 98 and yet leave liner 94 on lateral walls 96 and 100. With liner 94 removed from bottom 98 of trench 90, material 102 can be coupled to substrate 70 at bottom 98. Substrate 70 is preferably coupled to ground or a substrate bias signal. In such an embodiment, capacitors 40 and 42 would have plates 41 and 43 coupled to ground. Therefore, capacitors 40 and 42 can be a grounded capacitive structure instead of a floating capacitive structure by etching liner 94 from bottom 98 of trench 90.

Figure 8:
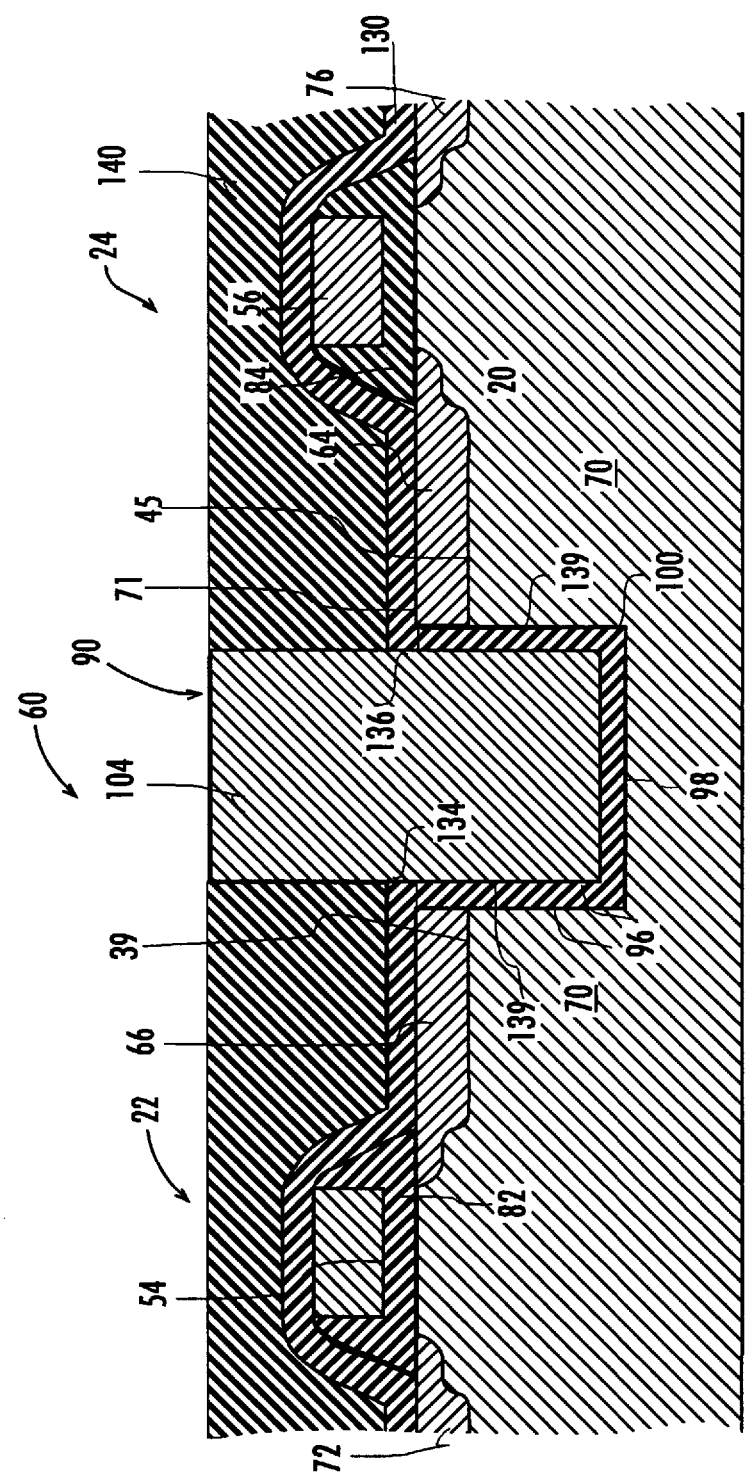
FIG. 8 is a cross-sectional view of a semiconductor substrate in accordance with a third preferred exemplary embodiment of the present invention, the substrate includes the portion of the memory cell schematically illustrated in FIG. 3.

With reference to FIG. 8, a cross-sectional view of substrate 70 including portion 60 in accordance with a third exemplary embodiment includes transistor 22 and transistor 24. Substrate 70 and portion 60 are similar to substrate 70 illustrated in FIG. 3. However, a material 104 is deposited in trench 90 instead of a material 102. Material 104 is preferably a tungsten material which is provided with other local interconnects (not shown) which are utilized in making cell 10. In this way, material 104 can be deposited without requiring separate process steps.

Figure 9:
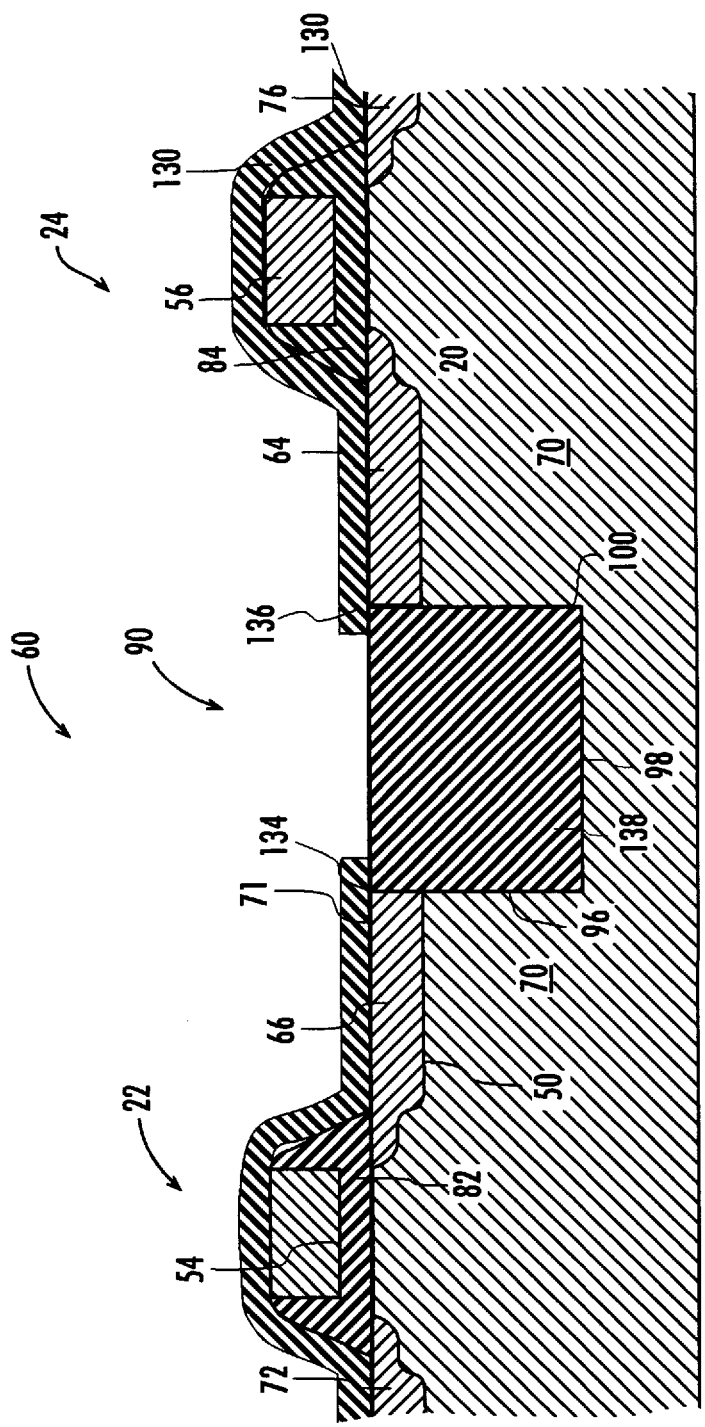
FIG. 9 is a cross-sectional view of the semiconductor substrate illustrated in FIG. 8 having an isolation trench.
Figure 10:
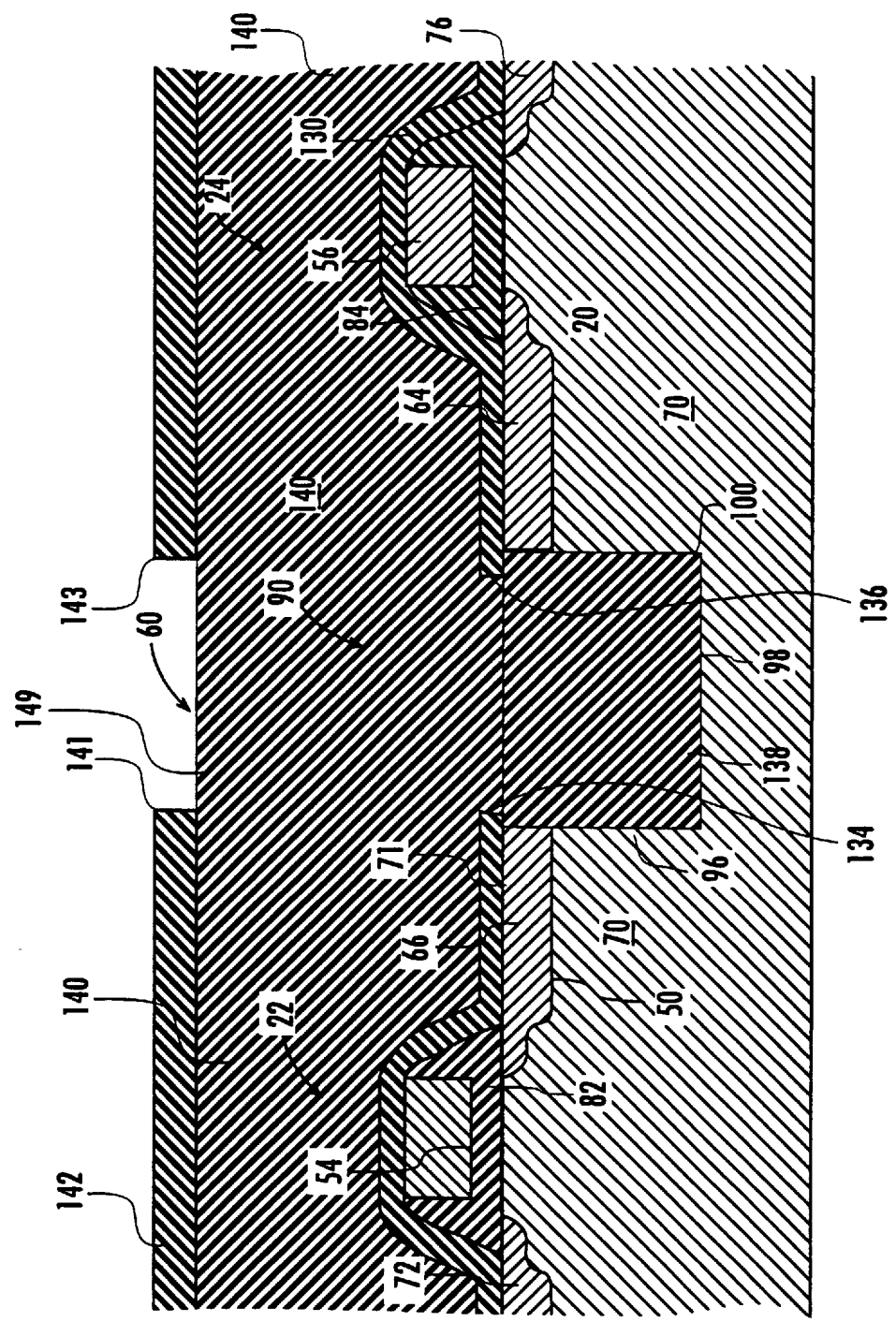
FIG. 10 is a cross-sectional view of the semiconductor substrate illustrated in FIG. 8 including an insulation layer and a photoresist layer.

With reference to FIGS. 8, 9, and 10, the method of manufacturing cell 10 is described as follows. In FIG. 9, portion 60 is shown having transistors 22 and 24 substantially formed, and trench 90 formed between drains 64 and 66. The capacitive structure associated with capacitors 40 and 42 (FIGS. 1 and 2), can be formed before or after transistors 22 and 24 are formed. Trench 90 is similar to trench 90 described with reference to FIGS. 4 and 5 and is filled with dielectric material 123.

With reference to FIG. 9, as in other embodiments, filled insulating material 123 inside trench 90 is first selectively removed from trench 90 exposing lateral wall 96, bottom 98 and lateral wall 100. In FIG. 10, standard local interconnect etch stop layer 130 is then deposited. Layer 130 is used as a stop layer during local interconnect etch. Layer 130 is deposited into the exposed trench 90 and forms an insulation liner 139 on lateral wall 96, bottom 98 and lateral wall 100. Standard process steps preferably include planarization techniques such as CMP. Next, a globally planarized layer of intermetal dielectric layer 140 for the purpose of electrical isolation is deposited, at the same time refilling the trench.

Layer 130 is preferably silicon nitride, silicon oxynitride, SiN4, SiON or other layer having good etch selectivity to layer 140. Layer 130 is approximately 600 A thick. Layer 140 is preferably a 8000 A thick (after planarization) insulative or dielectric material such as TEOS deposited CVD oxide.

A photoresist layer 142 is provided over layer 140 which selectively exposes a top surface 149 on layer 140 on top of trench 90. The opening in photoresist 142 as defined by an edge 141 and an edge 143 and is preferably slightly bigger than the width of trench 90 as defined by the opening formed by liner 139. The degree of oversize is determined by the alignment accuracy of the lithographic tool. After photoresist layer 142 and edges 141 and 143 are provided, substrate 70 is etched to remove layer 140 completely down to the bottom liner 139.

The photoresist definition and subsequent etch steps can be carried out at the same time as the standard local interconnect definition and etch steps, thereby substantially simplifying process steps. However, extra precaution must be taken to prevent shorting of drains 66 and 64 to the local interconnect conductive material 104 formed inside and above trench 90. Such precaution may involve measures to reduce misalignment error of lithography tool and reducing the opening as defined by edges 141 and 143 thereby reducing and adding variation to the effectiveness of the field capacitors. Thus, a separate photoresist definition and etch step is the preferred approach.

In FIG. 8, such embodiment is illustrated. During the etching of material 140, stop layer 130 will effectively provide insulation protection to portion of drain 64 and 66 which may be inadvertently exposed because of lithography tool misalignment. Finally, trench 90 is filled with conductive material 104, such as tungsten during the standard local interconnect process sequence. Alternatively, material 104 can be polysilicon, local interconnect material, metals or other conductor.

The process sequence illustrated in FIGS. 8–10 can make use of existing process steps and thus is simpler to implement than process sequence illustrated in FIGS. 4–7. However, because of the extra constraint on its liner thickness (serve as stop layer) and the generally lower dielectric constant of such film, the capacitive advantage is expected to be inferior to those illustrated in FIG. 4–7.

It is understood that, while the detailed drawings and specific examples given describe the preferred exemplary embodiments of the present invention, they are for the purpose of illustration only. The apparatus and method of the invention is not limited to the precise details, geometries, dimensions, and conditions disclosed. For example, particular layers are described as being particular sizes, other sizes could be utilized. Further, although polysilicon is used as the conductive material, other conductive materials may be utilized. Further, single lines in the various drawings can represent multiple conductors. Various changes can be made to the details without parting from the scope of the spirit of the invention which is defined by the following claims.

What is claimed is:

1. A method of manufacturing a memory cell having a field capacitor between a first storage node and a second storage node, the memory cell including first and second pull down transistors formed on a semiconductor substrate, the method comprising:

forming an isolation trench in the semiconductor substrate at a location between the first and second pull down transistors, the location being proximate the first storage node;

providing a liner within the isolation trench;

anisotropically etching the liner to remove the liner from a bottom of the trench; and depositing a conductive material in the trench to substantially fill the trench.

2. The method of claim 1 wherein the forming step includes:

etching the isolation trench to remove an oxide material from the isolation trench.

3. The method of claim 1 wherein the liner is an etch stop layer.

4. The method of claim 1 wherein the providing step includes growing an oxide material on a side wall of the trench.

5. A method of manufacturing a memory cell having a field capacitor between a first storage node and a second storage node, the memory cell including a first pull down transistor and a second pull down transistors formed on a substrate, the method comprising:

removing a trench dielectric in a trench separating the first pull down transistor and the second pull down transistor;

providing an etch stop layer, the etch stop layer lining a sidewall of the trench;

providing an insulating layer over the first pull down transistor and the second pull down transistor;

selectively removing the insulating layer from between the first pull down transistor and the second pull down transistor;

anisotropically etching the insulating layer to remove the insulating layer from a bottom of the trench; and depositing a conductive material in the trench, the conductive material substantially filling the trench.

6. The method of claim 5 wherein the selectively removing step is performed by etching during a local interconnect etching step.

7. The method of claim 5 wherein the etch stop layer is a silicon nitride layer.

8. The method of claim 5 wherein the conductive material is doped polysilicon or tungsten.

9. The method of claim 8 wherein the trench is 0.3 microns deep.

10. The method of claim 8 wherein the etch stop layer is silicon nitride.

11. A method of forming a capacitive structure in a memory cell at a location between two transistors in a semiconductor substrate, the method comprising:

forming a trench in the substrate at the location;

depositing an insulating layer over the substrate and within the trench;

anisotropically etching the insulating layer from a bottom of the trench;

filling the trench with a conductive material; and etching the insulating layer to remove the insulating layer from the substrate, whereby a capacitive structure is formed between the two transistors.

12. The method of claim 11, wherein the two transistors are formed on the substrate after said forming a trench step.

13. The method of claim 11, wherein the capacitive structure is a field capacitive structure.

14. The method of claim 11, wherein the capacitive structure is a biased capacitive structure.

15. The method of claim 11, wherein said forming a trench includes depositing a buffer oxide layer.

16. The method of claim 15, wherein said forming a trench includes depositing a barrier layer over the buffer oxide layer.

17. The method of claim 16, wherein said forming a trench includes etching a portion of the buffer oxide layer from the trench.

18. The method of claim 11, wherein said filling the trench is done during a local interconnect process.

19. The method of claim 11, wherein the conductive material is tungsten.

20. The method of claim 11, wherein the conductive material is polysilicon.

* * * * *